July 31, 1962 W. E. OLMON ET AL 3,046,651

SOLDERING TECHNIQUE

Filed March 14, 1958

INVENTORS
WILFRID E. OLMON
RICHARD J. ZELINKA
BY
Irwin M. Haugen
ATTORNEY

United States Patent Office 3,046,651
Patented July 31, 1962

3,046,651
SOLDERING TECHNIQUE

Wilfrid E. Olmon, Crystal, and Richard J. Zelinka, Lino Lakes, Minn., assignors to Minneapolis-Honeywell Regulator Company, Minneapolis, Minn., a corporation of Delaware Filed Mar. 14, 1958, Ser. No. 721,550
4 Claims. (Cl. 29—498)

The present invention relates broadly to a method of attaching an indium containing body to a second surface, and more particularly to a fluxless method of mounting an alloyed junction semiconductor device having an indium-rich body extending therefrom to a suitable support member.

In many arts today, and in particular electrical or semiconductor arts, a complete and uniform bond between various components has become an increasingly important factor in quality considerations. Generally speaking, these improved bonds may be achieved with the improved fluxing techniques, however, in connection with semiconductor devices the conventional fluxes create additional contamination problems and accordingly are not the entire solution to the situation. According to the present invention, a eutectic type bond may be employed in the complete absence of a flux to join indium or indium-rich externally situated alloying members of a semiconductor body to a suitable mounting base.

Briefly, a solder is selected which forms a eutectic with indium and of a composition which is on the indium-rich side of the eutectic point. A controlled volume of this solder is plated onto the surface to which the indium or indium-rich body is to be mounted. The pre-tinned layer is heated to a point which is in excess of its melting point and the indium containing body is placed in contact therewith. A leaching of indium from the indium containing body occurs, this leached indium forming a new compositional system with the tinned layer. In a predtermined period of time, sufficient indium has become leached from the indium containing body to completely saturate the solder layer at the temperature employed and the solder mixture commences to freeze. At this point the heating is discontinued and a uniform and complete bond is formed between the solder layer and the indium containing body. This body functions as an efficient conductive path or medium for electrical and heat energy. In semiconductor practice, it has been found desirable to utilize the mounting base as a conductive path for both heat energy and electrical energy, and this procedure enables superior bonding to be achieved without the need for corrosive and contaminating mixtures. Bonds prepared in this manner have been found to be free of thermal or electrical "hot spots" generated during operation of the device due to the presence of a non-uniform bond.

Therefore, it is an object of the present invention to provide an improved bonding technique for bonding indium or indium containing bodies to various surfaces.

It is a further object of the present invention to provide a fluxless mounting technique for alloyed type semiconductor devices.

It is yet another object of the present invention to provide an improved uniform and complete bond which is particularly adaptable for attaching alloyed semiconductor bodies to other surfaces.

It is yet a further object to provide a process for attaching an indium containing body which forms a component part of a junction semiconductor device to a surface without physically melting the indium and thereby altering the semiconductor junction.

Other and further objects of the present invention will become apparent upon a study of the following specification, appended claims, and accompanying drawings, wherein:

Figures 1, 2, 3:
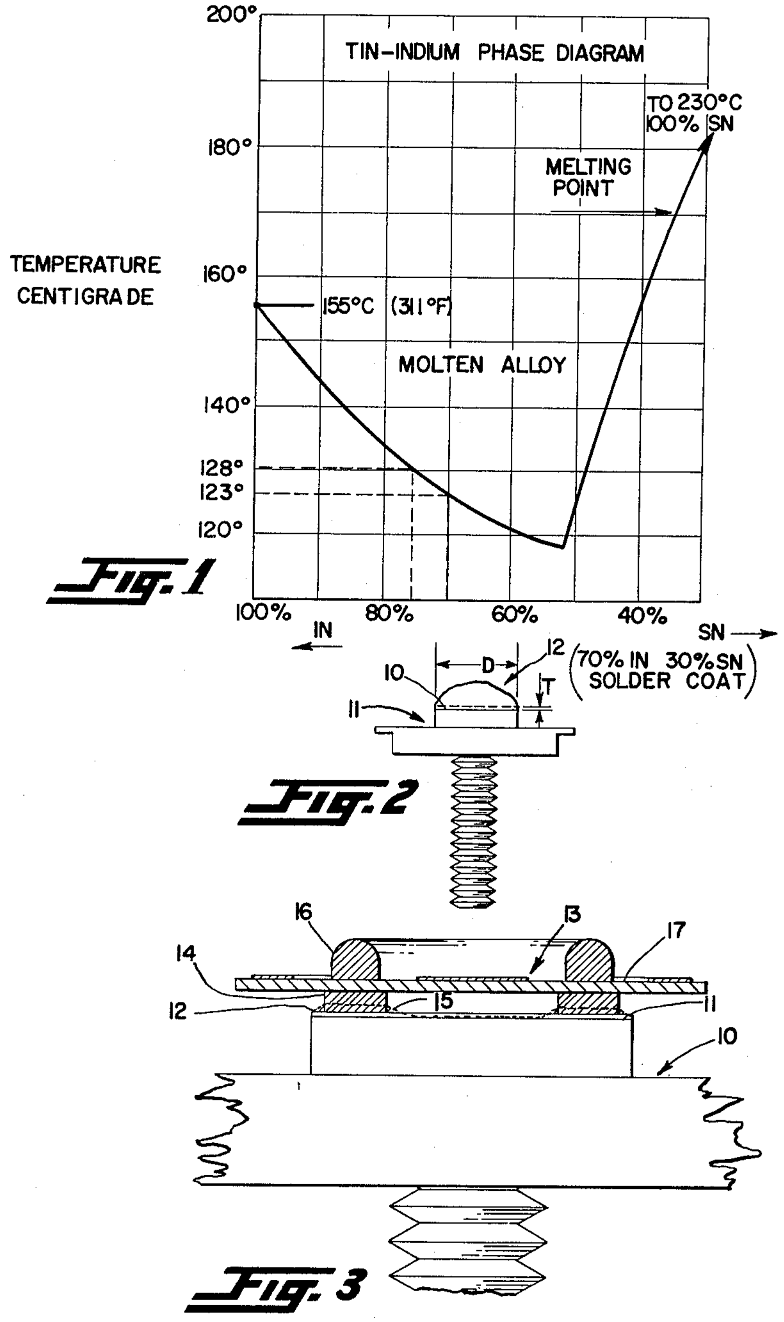
FIGURE 1 is a partial phase diagram for the tin-indium system showing the eutectic point and the indium-rich side generally.
FIGURE 2 is a front view of a mounting pedestal especially designed for a semiconductor body and illustrating the application of a solder layer thereto.
FIGURE 3 is a partial front view of a slightly enlarged scale of the partially broken away mounting pedestal shown in FIGURE 2 and illustrating a semiconductor body mounted thereon.

In accordance with the preferred modification of the present invention, a surface to which an indium or indium-rich body is to be attached is prepared for application of the initial solder layer, this solder being of a type capable of alloying with indium and acquiring an increased fusion temperature with increased indium content. Careful control of the surface together with careful volume application is critical in order that the added indium content will be capable of raising the fusion temperature sufficiently to properly prepare the bond. In other words, there must be sufficient solder present to leach sufficient indium from the indium containing body to create an appreciable incremental fusion temperature rise. The solder layer, particularly tin-indium solder, is heated to a temperature which is somewhat above the melting point thereof and the indium containing body is placed in contact therewith. Contact is maintained until a certain amount of indium has gone into the solder layer, thereby increasing the fusion temperature of the new composition. The indium rich body consists almost entirely of indium, and the mass of this body is likewise considered relative to the volume of tin-indium solder initially employed. Therefore, a controlled volume of indium will be leached from the indium member and undesirable electrical contacts will not be formed. It is basically desirable to employ a certain amount of agitation between the bodies while forming the bond in order to remove traces of indium oxide film which may be formed on the surface. In order to more particularly describe the various aspects of the present invention, a specific example is provided hereinbelow.

*Example 1.*—Referring particularly to the accompanying drawings, the semiconductor mounting surface 10, the copper pedestal, generally designated 11, which is about .320 inch in diameter is coated with a solder layer 12 consisting of 70% indium and 30% tin. The phase diagram of this solder mixture is partially shown in FIGURE 1. The solder layer is planed to a thickness T of between 0.002 and 0.003 inch and a flat surface of known thickness is thereby available. The melting temperature of the solder mixture is approximately 123° C. The semiconductor device 13 having a collector ring 14 with an I.D. of .220 inch, an O.D. of .285 inch and being .014 inch thick is placed in contact with the molten solder surface and gentle pressure is applied along with slight agitation thereto, the molten solder surface being held at a controlled constant temperature of 128° C. Contact is maintained until the solder composition becomes enriched with indium to the extent of 76% indium—24% tin, this composition solidifying at 128° C., and a freezing of the system occurs. At this temperature, the resultant soldering layer is semi-solid in nature and has sufficient strength to firmly hold the collector ring in place. The above alloying technique at these temperatures is completed in from 20 to 30 seconds.

A predetermined portion of the collector 14 is melted back by this process, this portion depending upon various features of the process including initial volume of the solder, temperature differential between the melting point of the solder layer and the temperature at which the mounting surface is maintained as well as the original volume of the semiconductor alloyed ring body. It is critical that the predetermined portion be sufficiently small that actual contact is avoided between the semiconductor body 17 and the mounting base 11. It is possible to achieve good results with collectors as thin as 0.008 inch, and the limiting factor has been found to be the tendency of the solder due to surface tension to "climb" the collector ring and make physical contact with the wafer body, as illustrated at 15.

If desired, electrode wires or electrode leads may be attached to the semiconductor device simultaneously with the mounting technique and utilizing essentially the same methods. In this connection, a lead wire is coated with a layer of 70% indium—30% tin solder and is placed in contact with the alloyed body emitter such as the ring 16.

It will be appreciated that the specific embodiments In this connection, the device is maintained at 128° C., at which temperature the solder coating will melt and the same system of bonding may be achieved. In this connection, the electrode lead may be fabricated in the form of a substantially closed ring, such as is the configuration of the emitter ring 16.

It will be appreciated that if the specific embodiments disclosed herein are presented for purposes of illustration only and are not to be construed as a limitation to the coverage to which the applicants are reasonably entitled. It will be appreciated therefore, that various other modifications may be employed which do not depart from the spirit and scope of the invention disclosed herein.

I claim:

1. The method of attaching an indium rich alloyed junction of a semiconductor body to a mounting pedestal, said method including the steps of coating the surface of said mounting pedestal with a relatively thin layer of indium-tin solder including from about 52% up to about 70% indium, balance tin, heating said layer to a predetermined temperature exceeding the fusion temperature thereof, but substantially below the melting point of said indium rich alloyed junction placing said alloyed junction in contact with said layer and maintaining contact until the indium content of said layer had increased and a composition having a fusion temperature substantially equal to said predetermined temperature is formed.

2. The process as set forth in claim 1 being particularly characterized in that the solder layer has a composition of about 70% indium—30% tin.

3. The method of attaching a semiconductor member having an externally extending indium-rich alloying member to a mounting pedestal, said method including the steps of coating the surface of said pedestal with a relatively thin layer of a solder consisting of about 70% indium—balance tin, heating said layer to a temperature of about 128° C. and maintaining said temperature, placing said indium alloying body in contact with said layer, and maintaining contact until the indium content of said layer has been increased due to leaching of said alloying member and a soldering composition having a fusion temperature substantially equal to said predetermined temperation is achieved.

4. The method of attaching a semiconductor member having an externally extending indium rich alloying member to a mounting pedestal, said method including the steps of coating the surface of said pedestal with a relatively thin layer of an indium-tin soldering alloy of greater than 52% indium content and having a certain predetermined thickness, the freezing point of said alloy being a function of indium content and increasing therewith, said soldering alloy being further characterized in that its melting point is substantially lower than the melting point of indium, heating said soldering alloy layer to a temperature which exceeds the fusion temperature thereof, but substantially below the melting point of said indium rich member, and placing said indium body in contact with said layer and maintaining said temperature until a certain quantity of indium has been leached from said alloying member and the indium enriched solder layer has become frozen.

References Cited in the file of this patent

UNITED STATES PATENTS

| | | |
|---|---|---|
| 2,373,117 | Hobrock | Apr. 10, 1945 |
| 2,426,467 | Nelson | Aug. 26, 1947 |
| 2,532,265 | Zickrick | Nov. 28, 1950 |
| 2,671,958 | Block | Mar. 16, 1954 |
| 2,735,050 | Armstrong | Feb. 14, 1956 |
| 2,746,140 | Belser | May 22, 1956 |
| 2,842,841 | Schnable et al. | July 15, 1958 |
| 2,859,512 | Dijksterhuis et al. | Nov. 11, 1958 |
| 2,897,587 | Schnable | Aug. 4, 1959 |
| 2,906,008 | Boegehold et al. | Sept. 29, 1959 |
| 2,984,774 | Race | May 16, 1961 |

OTHER REFERENCES

"The Review of Scientific Instruments," vol. 25, No. 2, pp. 180–183, February 1954.